United States Patent
Take

(10) Patent No.: US 10,332,852 B2
(45) Date of Patent: Jun. 25, 2019

(54) SEMICONDUCTOR DEVICE

(71) Applicant: TOYOTA JIDOSHA KABUSHIKI KAISHA, Toyota-shi, Aichi (JP)

(72) Inventor: Naoya Take, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/947,933

(22) Filed: Apr. 9, 2018

(65) Prior Publication Data

US 2018/0308814 A1 Oct. 25, 2018

(30) Foreign Application Priority Data

Apr. 19, 2017 (JP) ................................. 2017-083043

(51) Int. Cl.
*H01L 23/00* (2006.01)

(52) U.S. Cl.
CPC .............. *H01L 24/09* (2013.01); *H01L 24/05* (2013.01); *H01L 24/06* (2013.01); *H01L 24/48* (2013.01); *H01L 24/49* (2013.01); *H01L 2224/02175* (2013.01); *H01L 2224/04042* (2013.01); *H01L 2224/05624* (2013.01); *H01L 2224/0612* (2013.01); *H01L 2224/45147* (2013.01); *H01L 2224/48463* (2013.01); *H01L 2224/48824* (2013.01); *H01L 2224/49175* (2013.01)

(58) Field of Classification Search
CPC ............................... H01L 24/09; H01L 24/06; H01L 224/04042
See application file for complete search history.

(56) References Cited

U.S. PATENT DOCUMENTS 9,111,755 B1 * 8/2015 Tran ......................... H01L 24/03

FOREIGN PATENT DOCUMENTS

| JP | 2012-109419 A | 6/2012 |
| JP | 2012-129376 A | 7/2012 |
| JP | 2016-011589 A | 1/2016 |

* cited by examiner

*Primary Examiner* — Elias Ullah
(74) *Attorney, Agent, or Firm* — Sughrue Mion, PLLC

(57) ABSTRACT

A semiconductor device may include a semiconductor substrate, a first bonding pad provided on an upper surface of the semiconductor substrate and constituted of a metal including aluminum, a second bonding pad provided on the upper surface of the semiconductor substrate, and a first protrusion protruding from an upper surface of the first bonding pad. The first protrusion may be provided on the upper surface of the first bonding pad only at a position adjacent to a peripheral edge of the first bonding pad, the peripheral edge of the first bonding pad may be opposed to the second bonding pad.

5 Claims, 4 Drawing Sheets

SEMICONDUCTOR DEVICE

TECHNICAL FIELD

The disclosure herein relates to a semiconductor device.

BACKGROUND

As a bonding pad of a semiconductor device, a bonding pad constituted of a metal including aluminum has been known. When a wire is bonded to the bonding pad, the bonding pad is deformed by stress applied to the bonding pad at the bonding. Consequently, the metal that constitutes the bonding pad is ejected from a bonded portion with the wire to an outside of the bonded portion. This phenomenon is called an aluminum splash. When the aluminum splash reaches a vicinity of another bonding pad, an insulating distance between the bonding pads is shortened, and there may be a risk of a short circuit.

Japanese Patent Application Publication No. 2012-109419 discloses a bonding pad that includes a protrusion on its surface. The protrusion is disposed around a region to which a wire is to be bonded. The protrusion is provided along a peripheral edge of the bonding pad. When a wire is bonded to the bonding pad, the protrusion suppresses the aluminum splash from spreading to an outside of the bonding pad. Therefore, a short circuit between the aluminum splash and another bonding pad is suppressed.

SUMMARY

In a semiconductor device of Japanese Patent Application Publication No. 2012-109419, if a bonding position of the wire is displaced, there may be a case where the wire makes contact with the protrusion. When the wire is in contact with the protrusion, there may be a case where a bonding strength is not stabilized. Accordingly, the wire needs to be bonded accurately within a range surrounded by the protrusion. The disclosure herein provides a technology of suppressing a short circuit between bonding pads due to an aluminum splash, and of facilitating control of wire bonding.

A semiconductor device disclosed herein may comprise a semiconductor substrate, a first bonding pad provided on an upper surface of the semiconductor substrate and constituted of a metal including aluminum, a second bonding pad provided on the upper surface of the semiconductor substrate, and a first protrusion protruding from an upper surface of the first bonding pad. The first protrusion may be provided on the upper surface of the first bonding pad only at a position adjacent to a peripheral edge of the first bonding pad, and the peripheral edge of the first bonding pad may be opposed to the second bonding pad.

In the semiconductor device described above, even if an aluminum splash occurs when a wire is bonded to the first bonding pad, the first protrusion prevents the aluminum splash from extending to a second bonding pad side. Therefore, the aluminum splash is suppressed from reaching the second bonding pad. As such, even if an aluminum splash occurs when the wire is bonded, a short circuit between the first bonding pad and the second bonding pad can be suppressed suitably. Moreover, the first protrusion is provided on the upper surface of the first bonding pad only at the position adjacent to the peripheral edge of the first bonding pad, and the peripheral edge of the first bonding pad is opposed to the second bonding pad. Therefore, on the upper surface of the first bonding pad, a range other than a range where the first protrusion is provided can be utilized as a bonding area. Accordingly, a bonding position of the wire on the first bonding pad does not require very high accuracy. In other words, control of wire bonding to the first bonding pad can be facilitated.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
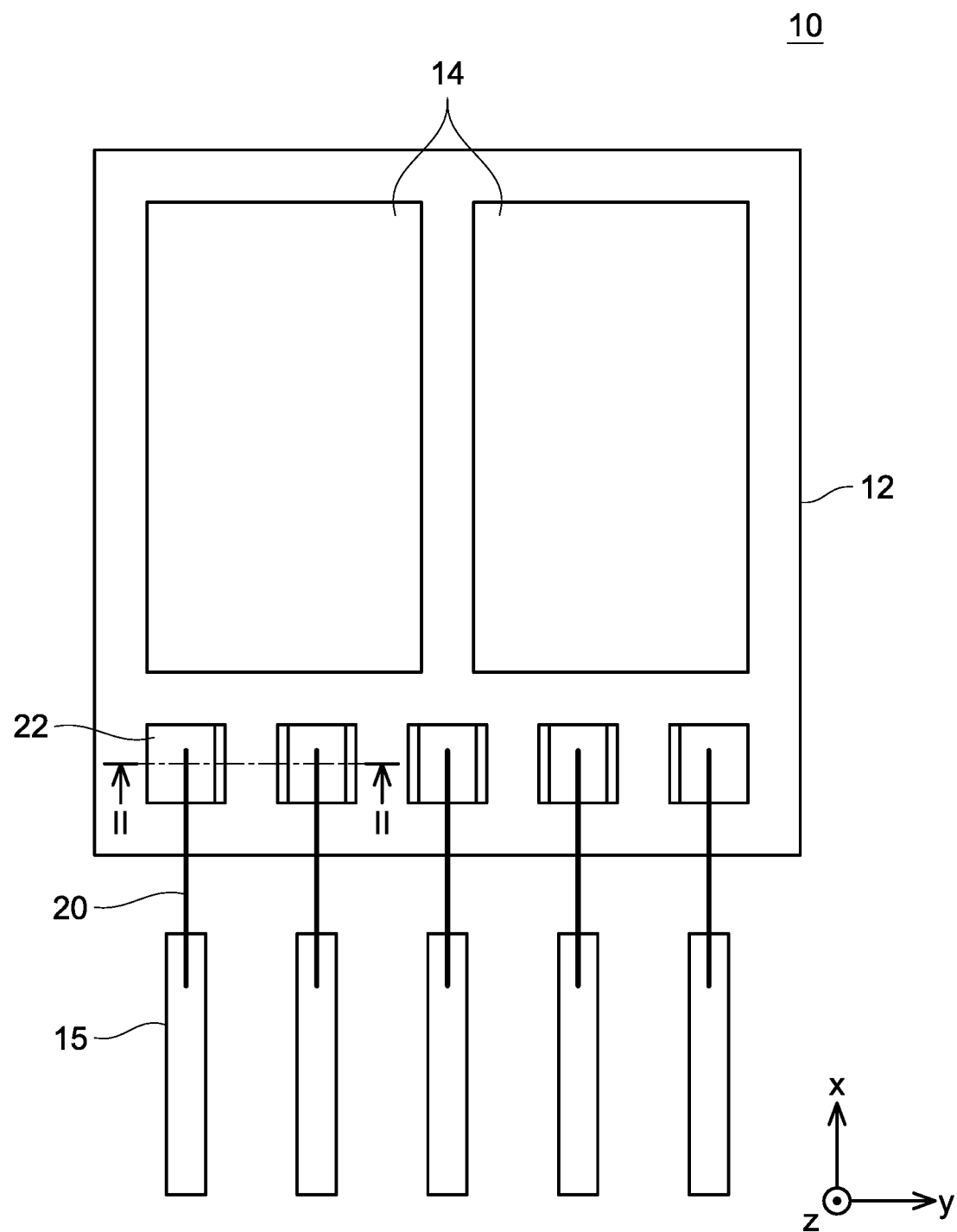
FIG. 1 is a plan view of a semiconductor device 10.

FIG. 1 shows an upper surface of a semiconductor device 10. The semiconductor device 10 includes a semiconductor substrate 12. The semiconductor substrate 12 is constituted of a semiconductor that mainly contains Si (silicon). It should be noted that the semiconductor substrate 12 may be constituted of a wide-band-gap semiconductor that mainly contains SiC (silicon carbide), GaN (gallium nitride), or the like. On an upper surface of the semiconductor substrate 12, main electrodes 14 and a plurality of signal bonding pads 22 are provided. Each of the signal bonding pads 22 has a rectangular shape in a plan view. A size of each signal bonding pad 22 is smaller than a size of each main electrode 14. The main electrodes 14 are respectively connected to wiring members, which is not shown, by solder. A plurality of lead wires 15 is disposed adjacent to one side of the semiconductor substrate 12. Each of the signal bonding pads 22 is connected to a corresponding one of the lead wires 15 by a wire 20 constituted of a metal including copper (hereinafter referred to as a copper wire 20). Moreover, although not shown, a lower electrode is provided on a lower surface of the semiconductor substrate 12. The lower electrode is connected to a wiring member, which is not shown, by solder. In the following, as shown in FIG. 1, one direction along the upper surface of the semiconductor substrate 12 is referred to as an x direction, a direction along the upper surface of the semiconductor substrate 12 and orthogonal to the x direction is referred to as a y direction, and a thickness direction of the semiconductor substrate 12 is referred to as a z direction.

Each of the signal bonding pads 22 is constituted of, for example, Al (aluminum) or a metal including aluminum such as AlSi (aluminum silicon). The signal bonding pads 22 are arranged to be spaced apart from one another in the y direction. In the present embodiment, five of the signal bonding pads 22 are arranged to be spaced apart in the y direction. The signal bonding pads 22 include, for example, a signal bonding pad that outputs a voltage indicating a temperature of the semiconductor substrate 12, a signal bonding pad that outputs a voltage indicating a value of a current that flows in the semiconductor substrate 12, a signal bonding pad that serves as a gate pad of the semiconductor substrate 12, and the like.

Figure 2:
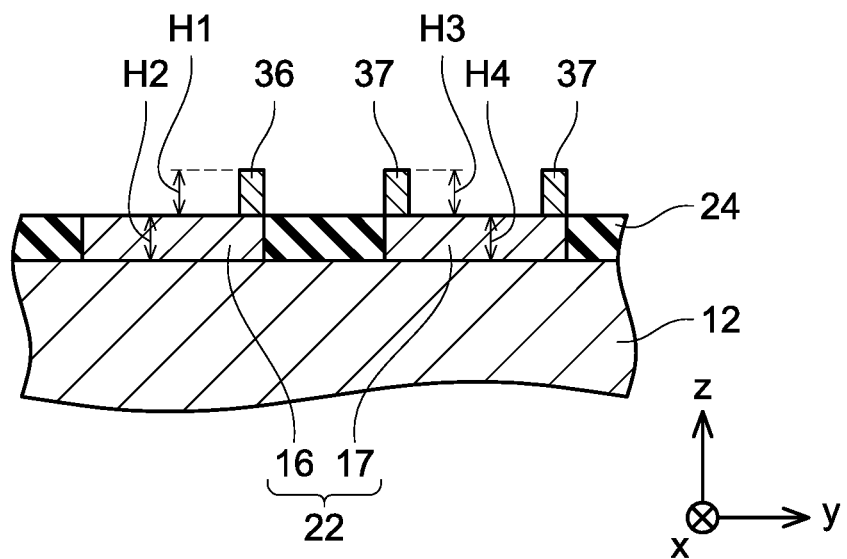
FIG. 2 is a cross-sectional view along a line II-II in FIG. 1, illustrating a state before a wire bonding.

FIG. 2 illustrates a cross section of the semiconductor device 10 along a line II-II in FIG. 1. FIG. 2 illustrates a state before the copper wires 20 are bonded. FIG. 2 illustrates two of the plurality of signal bonding pads 22. In the following, the signal bonding pad 22 on a left side in FIG. 2 is referred to as a first bonding pad 16, and the signal bonding pad 22 on a right side in FIG. 2 is referred to as a second bonding pad 17.

The first bonding pad 16 and the second bonding pad 17 are provided on the upper surface of the semiconductor substrate 12. An insulating film 24 is provided on the upper surface of the semiconductor substrate 12 in a range where neither the first bonding pad 16 nor the second bonding pad 17 is provided.

Figure 3:
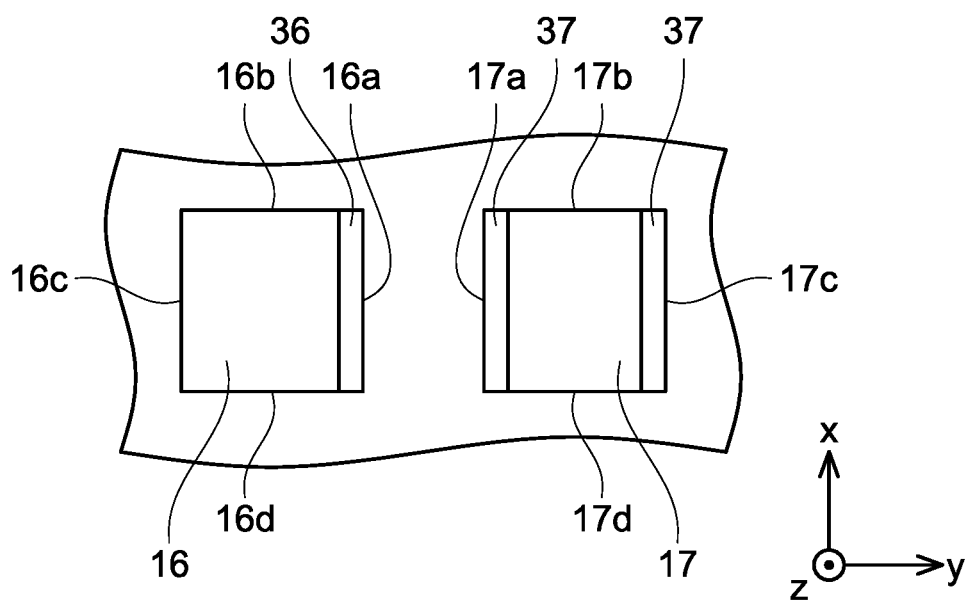
FIG. 3 is an enlarged plan view of a first bonding pad 16 and a second bonding pad 17.

In ranges where the first bonding pad 16 and the second bonding pad 17 are disposed, the upper surface of the semiconductor substrate 12 is flat. Moreover, an upper surface of the first bonding pad 16 and an upper surface of the second bonding pad 17 are both flat. A position of the upper surface of the first bonding pad 16 and a position of the upper surface of the second bonding pad 17 approximately coincide with a position of an upper surface of the insulating film 24. On the upper surface of the first bonding pad 16, a first protrusion 36 that protrudes from the upper surface of the first bonding pad 16 is provided. The first protrusion 36 is constituted of, for example, Ni (nickel). A Vickers hardness of the first protrusion 36 is higher than a Vickers hardness of the first bonding pad 16. The first protrusion 36 is provided on the upper surface of the first bonding pad 16 at a position adjacent to a peripheral edge of the first bonding pad 16, and the peripheral edge of the first bonding pad 16 is opposed to the second bonding pad 17. In the present embodiment, as shown in FIG. 3, the first protrusion 36 is provided only at a position adjacent to a side 16a of the first bonding pad 16 which is opposed to the second bonding pad 17. The first protrusion 36 has, for example, a rectangular solid shape. At a position adjacent to each of sides 16b, 16c, and 16d of the first bonding pad 16 which are not opposed to the second bonding pad 17, no protrusion that protrudes from the upper surface of the first bonding pad 16 is provided. In other words, in a range where the first protrusion 36 is not provided, the upper surface of the first bonding pad 16 is exposed.

As shown in FIG. 2, the first protrusion 36 is formed such that a height H1 of the first protrusion 36 is a half or more of a thickness H2 of the first bonding pad 16. It should be noted, in the disclosure herein, the height of a protrusion means a distance between the upper surface of a bonding pad and an upper surface of the protrusion, when measured in the z direction. Moreover, the thickness of a bonding pad means a distance between lower and upper surfaces of the bonding pad, when measured in the z direction.

On the upper surface of the second bonding pad 17, a second protrusion 37 that protrudes from the upper surface of the second bonding pad 17 is provided. The second protrusion 37 is constituted of, for example, Ni. A Vickers hardness of the second protrusion 37 is higher than a Vickers hardness of the second bonding pad 17. The second protrusion 37 is provided on the upper surface of the second bonding pad 17 at a position adjacent to a peripheral edge of the second bonding pad 17, and the peripheral edge of the second bonding pad 17 is opposed to the first bonding pad 16. In the present embodiment, as shown in FIG. 3, the second protrusion 37 is provided at a position adjacent to a side 17a of the second bonding pad 17 which is opposed to the first bonding pad 16. Another second protrusion 37 is also provided at a position adjacent to a side 17c of the second bonding pad 17 which is opposed to a bonding pad (the signal bonding pad 22 positioned in the middle in FIG. 1) positioned on an opposite side to the first bonding pad 16. Each of the second protrusions 37 has, for example, a rectangular solid shape. At a position adjacent to each of sides 17b and 17d of the second bonding pad 17, no protrusion that protrudes from the upper surface of the second bonding pad 17 is provided. In other words, in a range where the second protrusions 37 are not provided, the upper surface of the second bonding pad 17 is exposed. Moreover, as shown in FIG. 2, the second protrusions 37 are formed such that a height H3 of the second protrusions 37 is a half or more of a thickness H4 of the second bonding pad 17.

Figure 4:
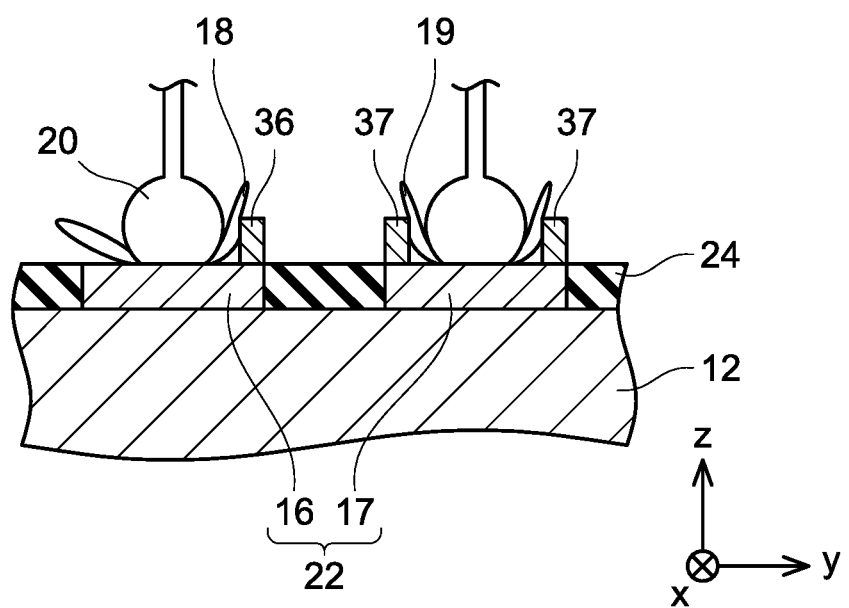
FIG. 4 is a cross-sectional view along the line II-II in FIG. 1, illustrating a state after the wire bonding.

FIG. 4 is a diagram illustrating a state where the copper wire 20 is bonded to each of the first bonding pad 16 and the second bonding pad 17. When the copper wires 20 are to be bonded, a capillary, which is not shown, is moved in an approximately vertical direction with respect to the upper surface of the semiconductor substrate 12, and a load is thereby imposed to a tip (ball portion) of each of the copper wires 20 in the vertical direction. When the copper wire 20 is bonded to the first bonding pad 16, a metal that exists at a bonding position (metal that constitutes the first bonding pad 16) is pushed out by the copper wire 20, and an aluminum splash 18 thereby occurs as shown in FIG. 4. Similarly, when the copper wire 20 is bonded to the second bonding pad 17, an aluminum splash 19 occurs.

In the semiconductor device 10 described above, even when the aluminum splash 18 occurs upon the wire being bonded to the first bonding pad 16, the first protrusion 36 prevents the aluminum splash 18 from extending to a second bonding pad 17 side. Therefore, the aluminum splash 18 is suppressed from reaching the second bonding pad 17. Similarly, even when the aluminum splash 19 occurs upon the wire being bonded to the second bonding pad 17, the second protrusion 37 prevents the aluminum splash 19 from extending to a first bonding pad 16 side. Therefore, the aluminum splash 19 is suppressed from reaching the first bonding pad 16. As such, even when an aluminum splash occurs upon a wire being bonded, a short circuit between the first bonding pad 16 and the second bonding pad 17 can be suppressed suitably.

Moreover, the first protrusion 36 is provided on the upper surface of the first bonding pad 16 only at the position adjacent to the side 16a. Therefore, on the upper surface of the first bonding pad 16, a range other than a range where the first protrusion 36 is provided can be utilized as a bonding area. Accordingly, a bonding position of the wire on the first bonding pad 16 does not require very high accuracy. In other words, control of wire bonding to the first bonding pad 16 can be facilitated. Moreover, the second protrusions 37 are provided on the upper surface of the second bonding pad 17 only at the positions adjacent to the sides 17a and 17c. Therefore, on the upper surface of the second bonding pad 17, a range where the second protrusions 37 are not provided can be utilized as a bonding area. Accordingly, a bonding position of the wire on the second bonding pad 17 does not require very high accuracy. In other words, control of wire bonding to the second bonding pad 17 can be facilitated.

The first protrusion 36 is formed such that the height H1 of the first protrusion 36 is a half or more of the thickness H2 of the first bonding pad 16. Accordingly, an insulating distance between the aluminum splash 18 occurring at the first bonding pad 16 and the second bonding pad 17 can be suitably increased. Moreover, the second protrusions 37 are formed such that the height H3 of the second protrusions 37 is a half or more of the thickness H4 of the second bonding pad 17. Accordingly, an insulating distance between the aluminum splash 19 occurring at the second bonding pad 17 and the first bonding pad 16 can be suitably increased.

The first protrusion 36 is constituted of Ni, which is a metal having a Vickers hardness higher than the Vickers hardness of the first bonding pad 16. Accordingly, the first protrusion 36 can be utilized as a probe area for electrical characteristics examination for the semiconductor device 10. Moreover, the second protrusions 37 are also constituted of Ni, which is the metal having a Vickers hardness higher than the Vickers hardness of the second bonding pad 17, and hence can bring an effect similar to the effect of the first protrusion 36.

Figure 5:
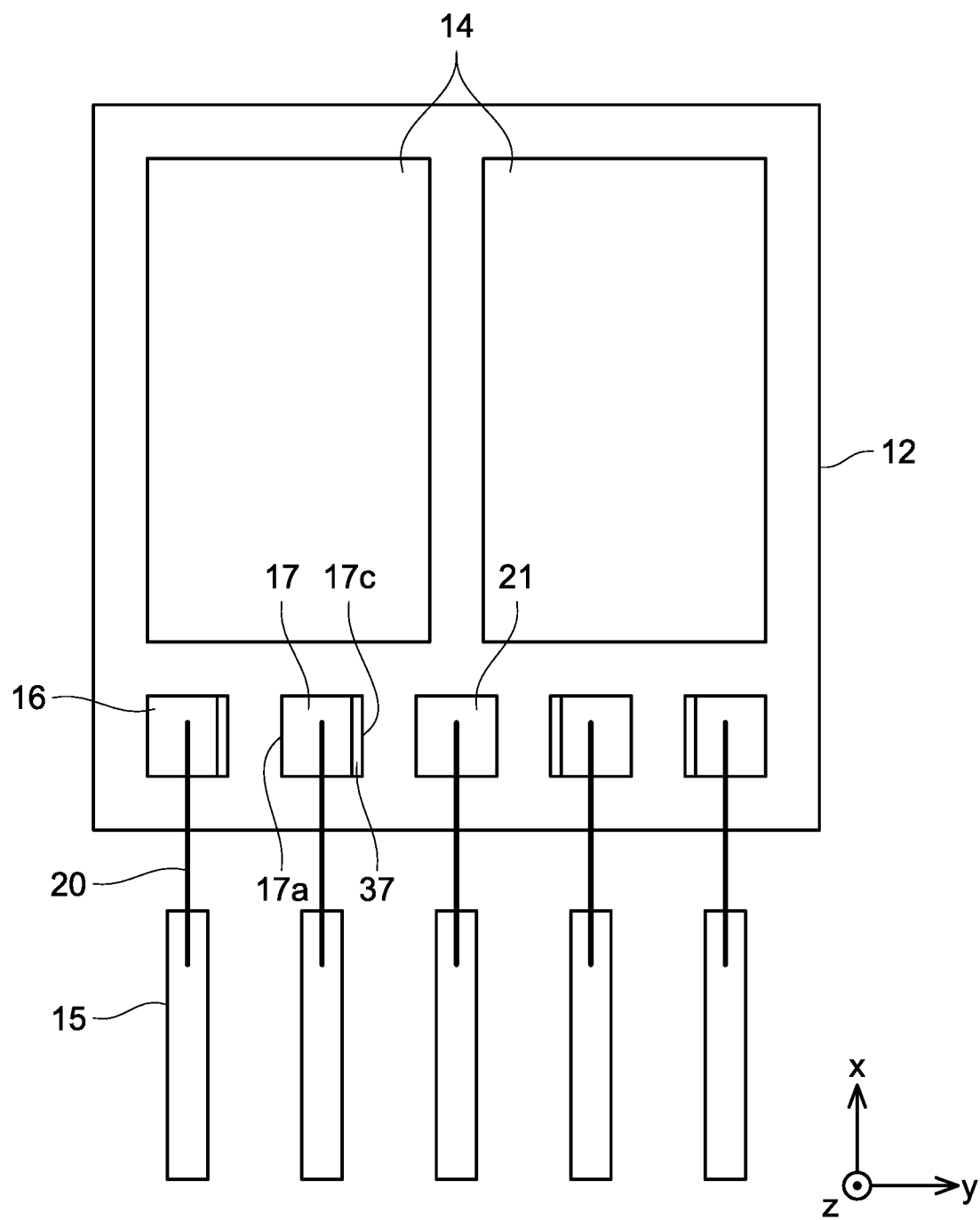
FIG. 5 is a plan view of a semiconductor device of a variant.

In the embodiment mentioned above, on the second bonding pad 17, the second protrusions 37 are respectively provided at the positions adjacent to the two sides 17a and 17c which are respectively opposed to the two bonding pads adjacent to the second bonding pad 17 on its left and right. However, the second protrusion 37 may be provided only at the position adjacent to one of the sides. In other words, as shown in FIG. 5, on the second bonding pad 17, the second protrusion 37 may be provided only at the position adjacent to the side 17c on a third bonding pad 21 side, and the second protrusion 37 may not be provided at the position adjacent to the side 17a on the first bonding pad 16 side. In this configuration, the second protrusion 37 is not provided at the position adjacent to the side 17a of the second bonding pad 17, whereas the first protrusion 36 is provided at the position adjacent to the side 16a of the first bonding pad 16. The first protrusion 36 prevents the extension of an aluminum splash occurring at the first bonding pad 16 toward the second bonding pad 17 side. Accordingly, a decrease in the insulating distance between the first bonding pad 16 and the second bonding pad 17 due to aluminum splashes that occur respectively at the first bonding pad 16 and at the second bonding pad 17 approaching each other can be suppressed. In other words, a short circuit between the first bonding pad 16 and the second bonding pad 17 can be suppressed. Moreover, since the second protrusion 37 is not provided at the position adjacent to the side 17a, this position can be utilized as the bonding area, and control of wire bonding to the second bonding pad 17 can be facilitated. As such, a configuration in which the protrusion is provided only at one of two sides which are respectively provided on the adjacent signal bonding pads 22 and are opposed to each other may be adopted.

Some of the technical features disclosed herein will be listed below. It should be noted that the respective technical elements are independent of one another, and are useful solely or in combinations.

In a configuration disclosed herein as an example, a height of the first protrusion may be a half or more of a thickness of the first bonding pad.

According to this configuration, an insulating distance between an aluminum splash occurring at the first bonding pad and the second bonding pad can be increased suitably.

In a configuration disclosed herein as an example, the first protrusion may be constituted of a metal having a Vickers hardness higher than a Vickers hardness of the first bonding pad.

According to this configuration, the first protrusion can be utilized not only as a function for preventing the extension of an aluminum splash, but also as a probe area for electrical characteristics examination for the semiconductor device.

In a configuration disclosed herein as an example, the semiconductor device may further comprise a second protrusion protruding from an upper surface of the second bonding pad. The second bonding pad may be constituted of a metal including aluminum. The second protrusion may be provided on the upper surface of the second bonding pad only at a position adjacent to a peripheral edge of the second bonding pad, and the peripheral edge of the second bonding pad may be opposed to the first bonding pad.

According to this configuration, an aluminum splash occurring at the second bonding pad can be prevented from extending to a first bonding pad side. A short circuit between the first bonding pad and the second bonding pad can be further suppressed.

In a configuration disclosed herein as an example, a height of the second protrusion may be a half or more of a thickness of the second bonding pad.

According to this configuration, an insulating distance between an aluminum splash occurring at the second bonding pad and the first bonding pad can be increased.

In a configuration disclosed herein as an example, the second protrusion may be constituted of a metal having a Vickers hardness higher than a Vickers hardness of the second bonding pad.

According to this configuration, the second protrusion can be utilized not only as a function for preventing the extension of an aluminum splash, but also as a probe area for electrical characteristics examination for the semiconductor device.

In a configuration disclosed herein as an example, the semiconductor device may further comprise a first wire connected to the first bonding pad and constituted of a metal including copper, and a second wire connected to the second bonding pad and constituted of a metal including copper.

Since a wire that includes copper is hard, an aluminum splash is thereby more likely to occur. Therefore, using the aforementioned bonding pad with the wire including copper is more advantageous.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
   a semiconductor substrate;
   a first bonding pad provided on an upper surface of the semiconductor substrate and constituted of a metal including aluminum;
   a second bonding pad provided on the upper surface of the semiconductor substrate; and
   a first protrusion protruding from an upper surface of the first bonding pad,
   wherein
   the first protrusion is provided on the upper surface of the first bonding pad only at a position adjacent to a peripheral edge of the first bonding pad, the peripheral edge of the first bonding pad being opposed to the second bonding pad, and
   the first protrusion is constituted of a metal having a Vickers hardness higher than a Vickers hardness of the first bonding pad.

2. The semiconductor device of claim 1, wherein
   a height of the first protrusion is a half or more of a thickness of the first bonding pad.

3. The semiconductor device of claim 1, further comprising;
   a second protrusion protruding from an upper surface of the second bonding pad,
   wherein
   the second bonding pad is constituted of a metal including aluminum, and
   the second protrusion is provided on the upper surface of the second bonding pad only at a position adjacent to a peripheral edge of the second bonding pad, the peripheral edge of the second bonding pad being opposed to the first bonding pad, and
   the second protrusion is constituted of a metal having a Vickers hardness higher than a Vickers hardness of the second bonding pad.

4. The semiconductor device of claim 3, wherein
   a height of the second protrusion is a half or more of a thickness of the second bonding pad.

5. The semiconductor device of claim 1, further comprising:
   a first wire connected to the first bonding pad and constituted of a metal including copper; and
   a second wire connected to the second bonding pad and constituted of a metal including 5 copper.

* * * * *